United States Patent [19]
Kobrinetz et al.

[11] Patent Number: 5,768,103
[45] Date of Patent: Jun. 16, 1998

[54] CIRCUIT BOARD APPARATUS AND APPARATUS AND METHOD FOR SPRAY-COOLING AN ELECTRONIC COMPONENT

[75] Inventors: Anthony Kobrinetz, Hoffman Estates; Michael K. Bullock, Wauconda, both of Ill.

[73] Assignee: Motorola, Inc., Schaumburg, Ill.

[21] Appl. No.: 709,247

[22] Filed: Aug. 30, 1996

[51] Int. Cl.$^6$ ....................................... H05K 7/20
[52] U.S. Cl. .................. 361/699; 165/80.3; 174/15.1; 257/714; 361/717; 361/720
[58] Field of Search .................. 165/80.2, 80.4, 165/908; 174/15.1, 252; 257/714; 361/688, 689, 698–699, 714–722

[56] References Cited

U.S. PATENT DOCUMENTS

| | | |
|---|---|---|
| 2,906,103 | 9/1959 | Saltzman .................. 174/15.1 |
| 4,912,600 | 3/1990 | Jaeger et al. .................. 174/15.1 |
| 5,675,473 | 10/1997 | McDana et al. .................. 165/80.4 |

FOREIGN PATENT DOCUMENTS 5152476  6/1993  Japan .................. 257/714

*Primary Examiner*—Gregory D. Thompson
*Attorney, Agent, or Firm*—Heather L. Creps

[57] ABSTRACT

The apparatus includes a housing having a cavity, the cavity sized to enclose an electronic component. The housing includes a first layer having a first aperture and a second layer having a second aperture. The second aperture is in communication with the first aperture and in communication with the cavity. The first and second apertures are sized to receive a fluid, atomize the fluid and discharge the atomized fluid into the cavity.

15 Claims, 2 Drawing Sheets

-PRIOR ART-

-PRIOR ART-

-PRIOR ART-

CIRCUIT BOARD APPARATUS AND APPARATUS AND METHOD FOR SPRAY-COOLING AN ELECTRONIC COMPONENT

FIELD OF THE INVENTION

This invention relates generally to the cooling of heat-generating electronic components, and, more particularly, to a circuit board apparatus and to an apparatus and a method for spray-cooling an electronic component.

BACKGROUND OF THE INVENTION

Electronic components such as integrated circuits, multi-chip modules, passive components and power transistors, which are generally mounted to surfaces such as circuit boards, may be heat sources which require cooling during normal operation.

Often, electronic components are cooled by natural or forced air convection which, because of the relatively poor thermal capacitance and heat transfer coefficients of air, requires moving large volumes of air past the components or past heavy heat sinks attached to the components. The air cooling process, however, may not provide uniform cooling of an electronic component, and may introduce undesired acoustic noise or contaminants, such as dust, onto the component.

Evaporative spray cooling features the spraying of atomized fluid droplets directly or indirectly onto a surface of a heat source such as an electronic component. When the fluid droplets impinge upon the component's surface, a thin film of liquid coats the component, and heat is removed primarily by evaporation of the fluid from the component's surface.

Although evaporative spray cooling is a preferred method of heat removal in many electronics applications, known spray cooling systems generally utilize specially-designed assemblies to deliver the fluid to, and to remove the fluid from, surfaces of electronic components. Typically, the assemblies include multiple parts and are attached to the surfaces of the circuit boards to which the electronic components are mounted. Thus, space on the circuit boards may be consumed by spray-cooling assemblies, extensive sealing may be required prior to operation of the spray-cooling system, and it may be difficult to shield electronic components from interference caused by electromagnetic radiation. In addition, known spray cooling systems may not effectively cool electronic components embedded within housings such as circuit boards.

There is therefore a need for an apparatus and a method for spray-cooling an electronic component which does not require a separate assembly to be attached to a surface to which the electronic component is mounted, which has a reduced number of parts, which shields against electromagnetic radiation, and which cools electronic components embedded within circuit boards.

SUMMARY OF THE INVENTION

According to an aspect of the present invention, the foregoing needs are addressed by an apparatus for spray-cooling an electronic component including a housing having a cavity, the cavity sized to enclose an electronic component. The housing includes a first layer having a first aperture and a second layer having a second aperture. The second aperture is in communication with the first aperture and in communication with the cavity. The first and second apertures are sized to receive a fluid, atomize the fluid and discharge the atomized fluid into the cavity.

According to another aspect of the present invention, a circuit board apparatus includes a first plurality of layers forming a first wall. A second plurality of layers forms a second wall. The second wall is coupled to the first wall. A third plurality of layers forms a third wall. The third wall is also coupled to the first wall. A fourth plurality of layers forms a fourth wall which is coupled to the second wall and coupled to the third wall. The first, second, third and fourth walls define a cavity. At least some layers of the fourth plurality of layers have at least one aperture therein. The apertures collectively form a nozzle sized to atomize a fluid and to discharge the fluid into the cavity.

According to a further aspect of the present invention, a method for spray-cooling an electronic module includes providing a housing having a cavity, the cavity sized to enclose the electronic component. The housing includes a first layer having a first aperture and a second layer having a second aperture. The second aperture is in communication with the first aperture and in communication with the cavity. Next, a fluid is supplied to the first aperture. The first and second apertures atomizing the fluid, and the atomized fluid is discharged into the cavity.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE PREFERRED EMBODIMENTS

Figure 1:
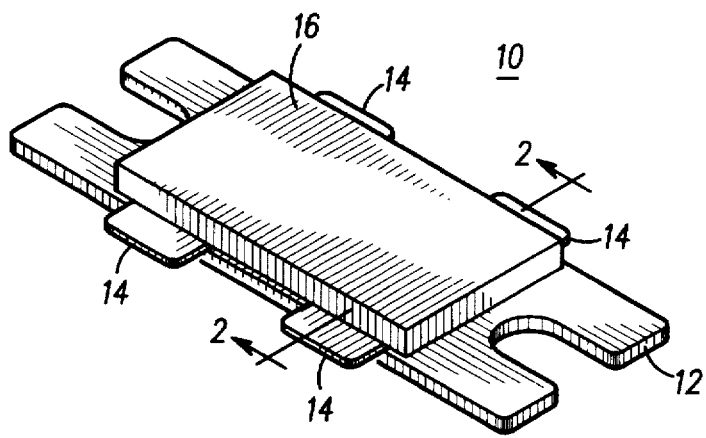
FIG. 1 is a perspective view of a typical electronic component.

Turning now to the drawings, wherein like numerals designate like components, FIG. 1 is a perspective view of a typical electronic component 10, which includes a device pedestal 12, or flange; a number of terminals 14; a cover 16; and one or more dies (not shown), which are enclosed by cover 16.

Electronic component 10 may be, for example, an NPN Silicon Radio Frequency (RF) Power Transistor, available from Motorola, order number MRF899/D. References to electronic component 10 will be understood to apply not only to component 10 as depicted in FIG. 1, but also to differently-configured power transistors such as a flangeless RF power transistor, available from Motorola, order number SRF7016, and to completely different components, including but not limited to passive components, all types of integrated circuits, multi-chip modules, and hybrid circuits.

Figure 2:
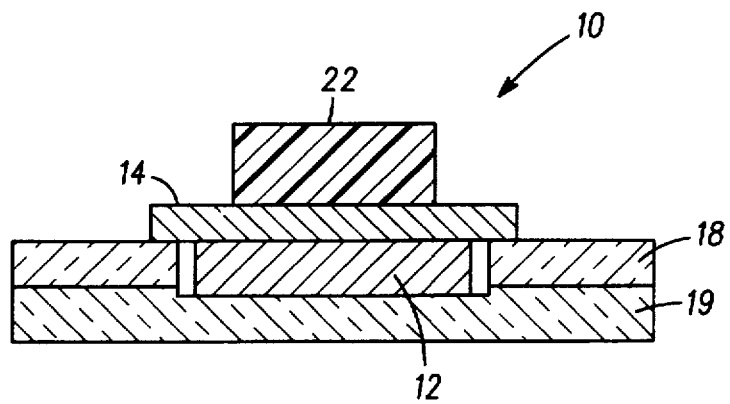
FIG. 2 is a front view along line 2—2 of the electronic component depicted in FIG. 1, illustrating a typical manner of mounting the component to a substrate.

FIG. 2 is a front view along line 2—2 of electronic component 10, illustrating a manner of mounting component 10 to a substrate 18 using a carrier plate 19. Substrate 18 preferably comprises one or more layers of ceramic, but may be glass-filled epoxy, liquid-crystal polymer, teflon, alumina, high-temperature plastic or another material. Carrier plate 19 may be made, for example, of ceramic, copper, aluminum-silicon carbide (AlSiC) or graphite. Carrier plate 19 is optional, and need not be used.

As shown, terminals 14 are in communication with substrate 18. Terminals 14 may be attached to substrate 18 or to another device such as a metalization region (not shown) located on substrate 18 in a variety of ways, such as by soldering or using conductive epoxy. A heat-generating die 22 is positioned on or between terminals 14 (cover 16, shown in FIG. 1, has been removed and is not shown in FIG. 2). Flange 12, which may provide an electrical grounding surface and enhanced heat spreading for die 22, may be secured to carrier plate 19 in a variety of ways, using screws, for example.

Figure 3:
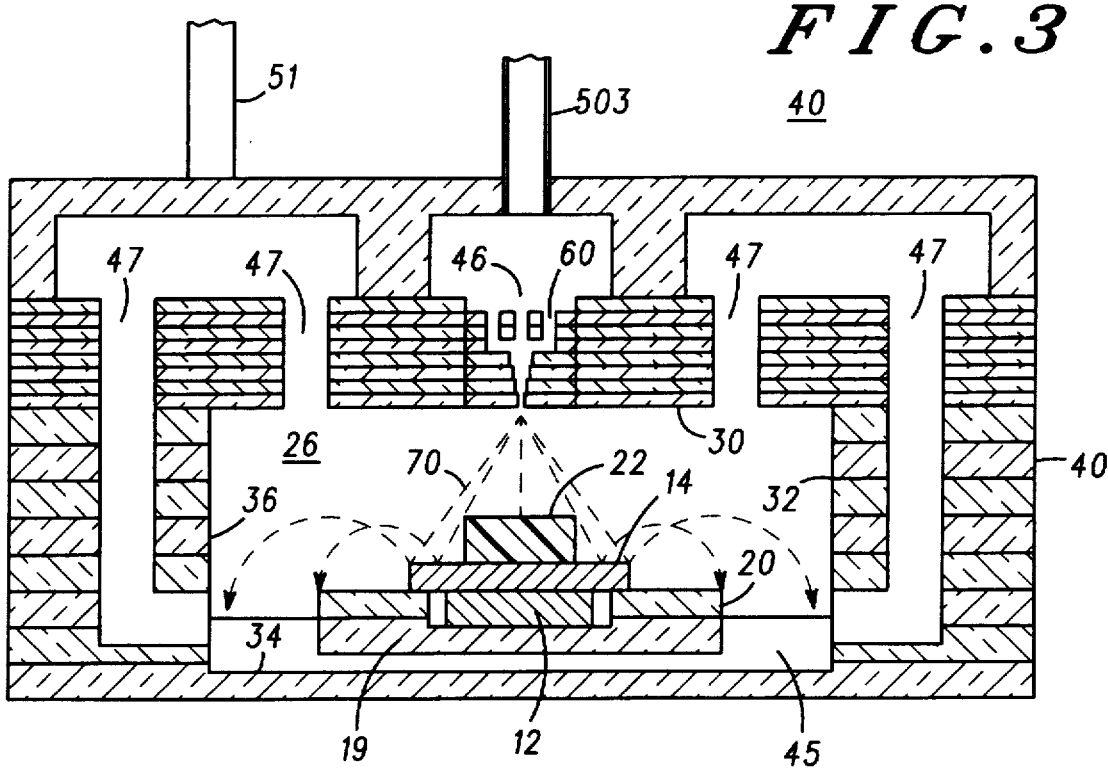
FIG. 3 is a view of an apparatus for housing and spray-cooling the electronic component shown in FIGS. 1 and 2, according to a preferred embodiment of the present invention.
Figure 3:
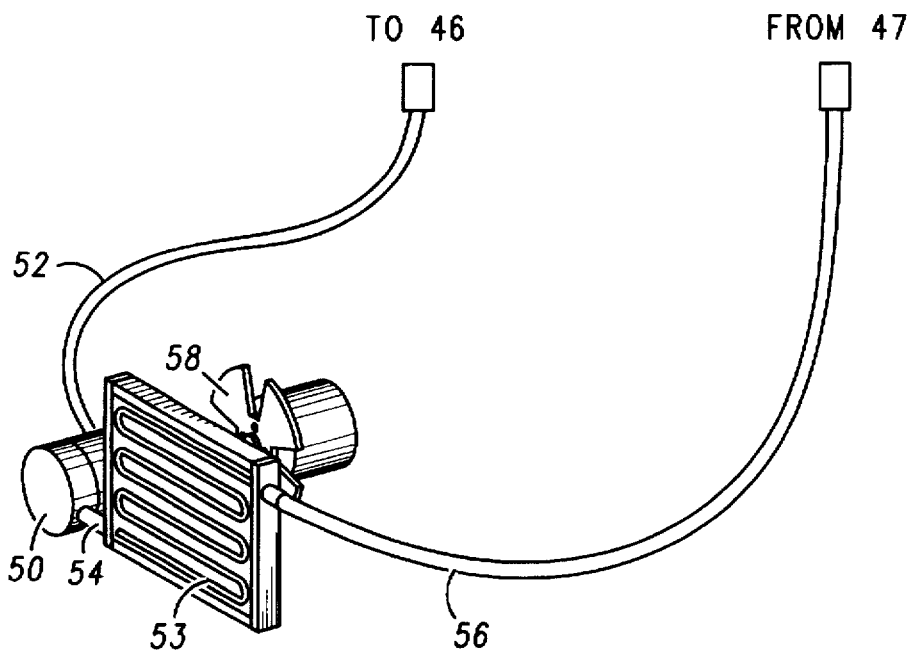

FIG. 3 is a front cross-sectional view of a housing 40, such as a circuit board, for electronic component 10, constructed according to a preferred embodiment of the present invention. Housing 40, which preferably comprises multiple layers of ceramic, but may also be glass-filled epoxy, liquid-crystal polymer, teflon, alumina, high-temperature plastic or another material, includes a cavity 26, formed using well-known techniques, in which electronic component 10 is mounted as described in connection with FIG. 2. As shown, each layer of housing 40 is approximately 0.206 millimeters in thickness, but each layer may be any suitable thickness. Conceptually, four walls 30, 32, 34 and 36 define cavity 26, each wall having a plurality of layers. As shown, cavity 26 has a rectangular cross-section but may have any suitable cross-sectional shape. Cavity 26 may also include an electromagnetic interference-attenuating material (not shown).

One suitable method of encapsulating component 10 within cavity 26 includes forming housing 40 as two or more separate pieces of ceramic, which may be separately fired at a temperature suitable to fuse their layers. Then, after electronic component 10 has been mounted to at least one of the pieces, the pieces may be permanently attached using well-known materials and techniques. Alternatively, if electronic component 10 is able to withstand high temperatures, housing 40 may be fired and fused together as a single piece.

One or more nozzles 60 are preferably disposed in top wall 30 of housing 40. A single nozzle 60 is shown. Nozzle 60 is preferably a miniature atomizer such as a simplex pressure-swirl atomizer. Simplex pressure-swirl atomizers are described in detail in S. K. Chen et al., "Factors Influencing the Effective Spray Cone Angle of Pressure-Swirl Atomizers", Journal of Engineering for Gas Turbines and Power, Vol. 144, pp. 97–103, January 1992, incorporated herein by reference.

Figure 4:
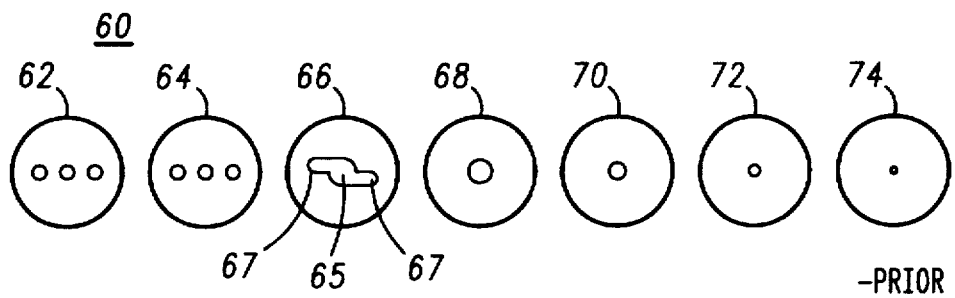
FIG. 4 depicts top views of individual apertures of the nozzle shown in FIG. 3.

Nozzle 60 is integral to housing 40, preferably constructed from a number of well-known apertures of various sizes and shapes, shown as parts 62–74 in FIG. 4. According to the preferred embodiment of the present invention, parts 62, 64, 68, 70, 72 and 74 may comprise one or more layers of housing 40, the layers having the apertures formed therein.

When the layers are stacked one on top of the other, nozzle 60, which atomizes a fluid, is formed. Parts 62 and 64 feature three apertures which serve as inlets for the fluid. Part 66 includes an elongated aperture, referred to herein as a swirl aperture. Outer portions 67 of the swirl aperture begin a rotational flow of the fluid and center portion 65 of the swirl aperture maintains a central pressure, forcing the rotating fluid through subsequent pieces and filling a spray cone with fluid. Apertures of parts 68, 70, 72 and 74 become progressively smaller, part 74 having an aperture, for example, on the order of 0.15 mm in diameter. When the rotating fluid exits the aperture of part 74, the centrifugal force of the fluid is much greater than its shear strength, so that a fine cone of mist exits nozzle 60.

Referring again to FIG. 3, operation of a closed-loop system for spray-cooling electronic module 10 within housing 40 according to a preferred embodiment of the present invention may be described. A fluid pump 50, which is connected via tube 52 to a fluid inlet port 46, supplies a coolant fluid to nozzle 60. Tube 52 may be coupled to fluid inlet port 46 using a barbed fitting 53, or by any other suitable means.

Nozzle 60 atomizes the coolant (described in connection with FIG. 4) and discharges an atomized fluid 70 into cavity 26 and onto one or more dies 22 of electronic component 10. Fluid 70 may be discharged from nozzle 60 at an angle to top wall 30, preferably at a substantially perpendicular angle to top wall 30. When atomized fluid 70 impinges upon the surface of die 22, a thin liquid film coats die 22, and heat is removed primarily by evaporation of fluid 70 from die 22.

Excess fluid 70 is collected and removed via lower exhaust pressure from housing 40 by fluid outlet ports 47, preferably integrally formed by layers of housing 40 using techniques similar to those used to create cavity 26. A sump layer 45, which collects any condensed fluid, may be present to reduce the possibility of flooding cavity 26, and further to act as a heat sink to aid in the evaporation of fluid 70.

A condenser 53, connected to pump 50 by tube 54 and to fluid outlet ports 47 by tube 56, receives fluid from fluid outlet ports 47. Tube 56 may be coupled to fluid outlet ports 47 using one or more barbed fittings 51, for example, or by any other suitable means. Condenser 53 rejects heat from the fluid, returning it to primarily a liquid phase. Fan 58 may be used to extend the cooling capacity of condenser 53. Cooled fluid is supplied from condenser 53 to pump 50. Thus, a closed-loop flow of coolant is formed. It will be appreciated that at any given point the coolant may be a vapor, a liquid or a vapor and liquid mixture.

The coolant fluid may be any dielectric coolant, such coolants being well-known and widely available. One example of a suitable coolant is 3M's Fluorinert™ dielectric fluid, available from 3M, order number FC-72.

Another perfluorocarbon fluid similar to 3M's Fluorinert™ dielectric fluid is available from Ausimont Galden®.

It is contemplated that any conventional means for providing flow of a coolant may be used in conjunction with the described embodiments of the present invention, and that more than one housing 40 may be connected to a single source of coolant or that one or more sources of coolant may be connected to a single housing 40, for example, for redundancy purposes.

Sizes of fluid pump 50, condenser 53 and fan 58 should be selected based on heat removal and flow rate requirements. For example, a typical closed-loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

An electronic component or a group of electronic components having a power density of up to 300 Watts per square centimeter which has been embedded in a housing 40 such as a circuit board is effectively cooled using the disclosed apparatus. Thus, large, high heat-generating electronic components may be embedded within housings 40. The removal of heat directly from individual electronic components helps to reduce operating temperatures of the components, increasing reliability through reduction of thermal variation and associated thermal stresses.

Top wall 30 of housing 40 may be placed close to the surface of electronic component 10 because spacing is not governed by air volume requirements. Thus, packaging size for the electronic component may be reduced. In addition, unlike air cooling, which is most effective when heat is spread over a large area, for example, over a large heat sink, spray-cooling encourages heat concentration, another factor contributing to reduced packaging volume and weight.

Selectively embedding electronic components within circuit boards, which may be isolated spots of high heat-load in otherwise low heat-load areas of an electronic module, may help to reduce surface area on a crowded electronic module that would have been devoted to mounting a traditional spray-cooling system. Thus, electronic module sizes should not increase because of the spray-cooling system.

The apparatuses and methods described herein result in a hermetically sealed electronic component which is substantially protected from the interference effects of electromagnetic radiation and a spray-cooling system with few parts.

Forming nozzles directly within a housing such as a circuit board, rather than individually bonding nozzles to a manifold, substantially reduces the chance that contaminants from bonding agents such as solder, or other contaminants from other sources, will be captured by the cooling fluid and corrode or clog the nozzles.

It should be appreciated that the present invention is not limited to cooling an electronic component, but may be adapted to cool any heat source.

It is further contemplated that wherever sealing and/or fastening may be required, numerous methods and materials may be used. For example, fasteners such as screws, compliant gaskets, ultrasonic welding, brazing, soldering or swaging may be utilized.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for spray-cooling an electronic component, comprising:
    a housing having a cavity, the cavity sized to enclose the electronic component, the housing comprising:
        a first layer having a first aperture,
        a second layer having a second aperture, the second aperture in communication with the first aperture and in communication with the cavity,
        the first and second apertures sized to receive a fluid, atomize the fluid and discharge the atomized fluid into the cavity.

2. The method according to claim 1, wherein the first layer comprises ceramic.

3. The apparatus according to claim 1, further comprising:
    a fluid inlet port disposed in the housing, the fluid inlet port sized to supply the fluid to the first aperture.

4. The apparatus according to claim 1, further comprising:
    a fluid outlet port in communication with the cavity, sized to collect the fluid from the cavity.

5. The apparatus according to claim 4, further comprising:
    a fluid pump in communication with the fluid inlet port; and
    a condenser in communication with the fluid pump and the fluid outlet port,
    the condenser receiving the fluid from the fluid outlet port and supplying the fluid to the fluid inlet port, forming a closed loop fluid flow.

6. The apparatus according to claim 1, wherein the fluid comprises a dielectric fluid.

7. The apparatus according to claim 1, wherein a cross-sectional shape of the first aperture is substantially circualr.

8. The apparatus according to claim 1, further comprising:
    an electronic component disposed in the cavity.

9. The apparatus according to claim 8, wherein the electronic component is selected from the group consisting essentially of: a passive component, a multi-chip module and a radio frequency power transistor.

10. The apparatus according to claim 1, wherein the housing comprises a circuit board.

11. A circuit board apparatus, comprising:
    a first plurality of layers forming a first wall;
    a second plurality of layers forming a second wall, the second wall coupled to the first wall;
    a third plurality of layers forming a third wall, the third wall coupled to the first wall; and
    a fourth plurality of layers forming a fourth wall, the fourth wall coupled to the second wall and coupled to the third wall, the first, second, third and fourth walls defining a cavity,
    at least some layers of the fourth plurality of layers having at least one aperture therein, the apertures collectively forming a nozzle sized to atomize a fluid and to discharge the fluid into the cavity.

12. The circuit board apparatus according to claim 11, further comprising:
    an electronic component disposed in the cavity.

13. The circuit board apparatus according to claim 11, wherein the first, second, third and fourth plurality of layers comprise ceramic.

14. The circuit board apparatus according to claim 11, wherein each layer of the second plurality of layers has at least one aperture therein, the apertures collectively forming a fluid outlet port sized to remove the fluid from the cavity.

15. A method for spray-cooling an electronic component, comprising the steps of:
    providing a housing having a cavity, the cavity sized to enclose the electronic component, the housing comprising:
        a first layer having a first aperture,
        a second layer having a second aperture, the second aperture in communication with the first aperture and in communication with the cavity;
    supplying a fluid to the first aperture;
    atomizing the fluid by the first and second apertures; and
    discharging the atomized fluid into the cavity.

* * * * *